US011942948B2

United States Patent
Purto et al.

(10) Patent No.: US 11,942,948 B2
(45) Date of Patent: Mar. 26, 2024

(54) METHOD AND APPARATUS FOR FORMING WIDEBAND PRN SIGNALS

(71) Applicant: TOPCON POSITIONING SYSTEMS, INC., Livermore, CA (US)

(72) Inventors: Leonid Victorovich Purto, Moscow (RU); Sergey Sayarovich Bogoutdinov, Moscow (RU); Dmitry Anatolyevich Rubtsov, Moscow (RU)

(73) Assignee: TOPCON POSITIONING SYSTEMS, INC., Livermore, CA (US)

( * ) Notice: Subject to any disclaimer, the term of this patent is extended or adjusted under 35 U.S.C. 154(b) by 45 days.

(21) Appl. No.: 17/758,697

(22) PCT Filed: Oct. 8, 2021

(86) PCT No.: PCT/RU2021/000431
§ 371 (c)(1),
(2) Date: Jul. 12, 2022

(87) PCT Pub. No.: WO2023/059216
PCT Pub. Date: Apr. 13, 2023

(65) Prior Publication Data
US 2023/0283267 A1 Sep. 7, 2023

(51) Int. Cl.
*H03K 3/84* (2006.01)
*G01S 1/04* (2006.01)
(Continued)

(52) U.S. Cl.
CPC .............. *H03K 3/84* (2013.01); *G01S 1/0428* (2019.08); *G01S 7/023* (2013.01); *G01S 19/03* (2013.01);
(Continued)

(58) Field of Classification Search
CPC .......... H03K 3/84; H04B 1/713; H04B 1/707; H04B 15/00; G01S 1/0428; G01S 7/023; G01S 19/03; G01S 19/235; H04L 27/02
(Continued)

(56) References Cited

U.S. PATENT DOCUMENTS 5,960,028 A * 9/1999 Okamoto ................ H04J 13/10
375/150
2002/0127992 A1 9/2002 Fransis
(Continued)

FOREIGN PATENT DOCUMENTS

CN 101915931 B 7/2012

OTHER PUBLICATIONS

Kaplan et al., "Understanding GPS: Principles and Applications," Second Edition, 2006, 707 pgs.
(Continued)

*Primary Examiner* — Arnold M Kinkead
(74) *Attorney, Agent, or Firm* — Chiesa Shahinian & Giantomasi PC (57) ABSTRACT

An apparatus for forming wideband pseudo random noise signals includes a set of channels each comprising an NCO having a controlled frequency and phase and a PRN code generator, the NCO generating a strobe that is output to the PRN code generator. The PRN code generator forms a new sequence element of +1 or −1 in response to the strobe. The apparatus also comprises a first modulator having a plurality of weight coefficients, a plurality of multipliers each multiplying one of the weight coefficients, an adder outputting a sum of the plurality of multipliers output signals, and a mixer with a quadrature output signal multiplying the adder's output by sine and cosine of a low intermediate frequency. The apparatus also includes a processor controlling the set of channels, a transceiver module to receive and/or transmit quadrature signals, and an interface connecting the output of the mixer and the transceiver module.

18 Claims, 7 Drawing Sheets

(51) Int. Cl.
- *G01S 7/02* (2006.01)
- *G01S 19/03* (2010.01)
- *G01S 19/23* (2010.01)
- *H04B 1/713* (2011.01)
- *H04B 15/00* (2006.01)
- *H04L 27/02* (2006.01)

(52) U.S. Cl.
CPC ............ *G01S 19/235* (2013.01); *H04B 1/713* (2013.01); *H04B 15/00* (2013.01); *H04L 27/02* (2013.01)

(58) Field of Classification Search
USPC ...... 375/130, 150, 268, 371, 259; 331/78, 2; 342/357.24
See application file for complete search history.

(56) References Cited

U.S. PATENT DOCUMENTS

| | | |
|---|---|---|
| 2005/0003785 A1 | 1/2005 | Jackson et al. |
| 2005/0141602 A1 | 6/2005 | Hyun et al. |
| 2006/0165155 A1* | 7/2006 | Liu .................... H04B 1/71635 375/267 |
| 2008/0055014 A1 | 3/2008 | Tsfaty |
| 2008/0291973 A1 | 11/2008 | Azakkour et al. |
| 2016/0306049 A1 | 10/2016 | Tangudu et al. |

OTHER PUBLICATIONS

International Search Report and Written Opinion dated Jul. 7, 2022, in connection with International Patent Application No. PCT/RU2021/000431, 7 pgs.

* cited by examiner

METHOD AND APPARATUS FOR FORMING WIDEBAND PRN SIGNALS

FIELD OF THE INVENTION

The present disclosure relates generally to a method and apparatus for generating signals and, in particular, to forming wideband pseudo random noise signals for different applications.

BACKGROUND

Navigation devices for industrial applications often include a satellite navigation receiver for receiving satellite signals that can be used to determine a position of the receiver with a certain level of accuracy. These navigation devices are often supplemented with additional hardware modules for generating additional navigation signals. These additional navigation signals can be similar to the received satellite signals and used for operations such as calibration or modification of received satellite signals. The additional navigation signals can also be used as supplemental navigation signals to increase the accuracy of position determination based on the received satellite signals. Accordingly, the generated signals can be used for calibrating a receiving RF front-end, for subtracting disturbing signals (from its own or a closely located transmitter) from the received signal, for local positioning of other receivers, for mm-wave radars, etc. The applications described above are typically implemented in the same device, although the applications are typically not used and/or operated at the same time. In general, the generated additional navigation signals are wideband pseudo random noise ("PRN") signals.

If a generated additional navigation signal is used as a subtraction signal to be subtracted from a received signal to cancel an unwanted echoed signal or to solve a near-far problem in case of code division multiple access ("CDMA"), then the subtracted signal should be accurately adjusted in amplitude, carrier phase and code phase. This accurate adjustment of the subtracted signal is performed so that the generated additional navigation signal is synthesized as closely as possible to the received unwanted signal in order to be mitigated by the subtraction operation. For Direct Sequence CDMA ("DS-CDMA") signals which are PRN based on a known code sequence, the exact representation of signal shape means the reproduction of the end-to-end characteristic of the RF front-ends, through which the received signal passes. Typically, it is a Low Pass Filter ("LPF").

In other cases, when a CDMA signal is the generated additional navigation signal for global or local positioning, the generated signal can be presented as a sum of several signals on the basis of different PRN codes with different amplitudes, chip rates and sub-carriers.

There are known satellite signals that are generated as a sum of different codes. For example, the Galileo Composite Binary Offset Carrier ("CBOC") is a satellite signal that is generated as a sum of different codes. Some components of CBOC signal are transmitted at a larger amplitude than other components. A peculiarity of the apparatus generating such a CBOC signal is availability of a single numerically controlled oscillator ("NCO") causing fronts of all transitions for signal levels. In other words, all the added signal components have the same code phase. This device does not adjust phase using an arbitrary value. Such an apparatus cannot be used for generating signals for their subtraction from the received signal and as a result, it cannot be used for weakening a disturbing signal.

A known method and apparatus to obtain code phase with accurately generated fronts with the help of an interpolator at the output of a PRN-generator is similar to that of the method described above. The interpolator is a bank of transversal filters. To interpolate a multi-level signal at the generator's output, all the multiplication operations in the interpolator are multi-digit. The advantage of this implementation in the case of subtraction of undesirable signals is quality representation of the signal. A main drawback is the relatively high cost of the interpolator which typically uses a lot of area in a microchip. In addition, the added interpolator cannot be used to generate composite signals for local positioning systems. To generate a multi-level composite signal, apparatuses as described above need to be combined which can require the added expense of additional hardware.

Another method of solving a near-far problem is by subtracting a copy of the unwanted signal from the received signal. Such a subtraction is made at the output of a correlator. The subtracted value is taken from a table containing a cross-correlation function of a disturbing unwanted signal and the desired signal for all possible code phases and Doppler offsets. This method allows correcting the desired signal by eliminating interference effects on the level of correlation results. A drawback of this method is the necessity of storing and applying a large table for every possible pair of unwanted and desired signals. Certain signals (e.g., those not being tracked at the moment, because they are not found yet) cannot be corrected by this method.

The methods and apparatuses identified above make it possible to solve a problem related to generating wideband PRN signals to a certain degree. However, to solve multiple functions in the same apparatus requires additional hardware which can be cost prohibitive.

SUMMARY

In one embodiment, an apparatus for forming pseudo-random wideband signals comprises a set of channels each comprising a numerically controlled oscillator ("NCO") having a controlled frequency and phase and a pseudo-random number ("PRN") code generator, the NCO generating a strobe that is output to the PRN code generator. The PRN code generator forms a new sequence element of +1 or −1 in response to the strobe. The apparatus also comprises a first modulator having a plurality of weight coefficients, a plurality of multipliers each multiplying one of the weight coefficients, an adder outputting a sum of the plurality of multipliers output signals, and a mixer with a quadrature output signal multiplying the adder's output by sine and cosine of a low intermediate frequency. The apparatus also includes a processor controlling the set of channels, a transceiver module to receive and/or transmit quadrature signals, and an interface connecting the output of the mixer and the transceiver module.

In one embodiment, the interface comprises a quadrature DAC, the input of the quadrature DAC is connected to the quadrature mixer output, and the output of the quadrature DAC is connected to an RF-tract. The interface can alternatively comprise a quadrature ADC, the input of the quadrature ADC is connected to an RF front-end, and the output of the quadrature ADC is added to the output of the quadrature mixer.

In one embodiment, a quadrature ADC and quadrature DAC are additionally included in the interface, the input of the quadrature ADC and the output of the quadrature DAC is connected to an RF front-end, the signal from the output of the quadrature DAC is converted to an intermediate frequency or a radio frequency in a transmitting portion of the RF front-end, and then is converted back to a zero or a near-zero frequency in a receiving portion of the RF front-end, the signal is added at a radio frequency to a signal received from an antenna broadcasting radio or replacing the signal received from antenna broadcasting radio.

In one embodiment, the apparatus can be part of a transmitter or a receiver for local positioning signals or a part of a GNSS receiver.

A method for forming pseudo-random wideband signals is also disclosed herein.

DETAILED DESCRIPTION

A Wideband Pseudo Random Noise Former (WPRN Former) is used to accomplish multiple tasks including: calibrating a Global Navigation Satellite System ("GNSS") Radio Frequency ("RF") front-end by a pseudo-satellite signal; generating composite signals for local positioning; transmitting signals from a near transmitter with its further subtraction from the received signal, which partially solves a near-far problem; and generating signals for truck-platooning, mm-range radars, prism direction finding of a total station, etc.

In one embodiment, a basic WPRN former comprises:
(a) a set of channels with code generators, each channel including a PRN code generator and an NCO with a controlled frequency and a phase, the output of the NCO generating a strobe sent to PRN code generator which generates a new element of +1 and −1 sequence according to the received strobe;
(b) a modulator including:
  (1) a plurality of weight coefficients,
  (2) a plurality of multipliers multiplying one weight coefficient by the output of one of PRN code generator,
  (3) an adder outputting a sum of multipliers' outputs
  (4) a mixer with a quadrature output, the mixer multiplies the output of the adder by sines and cosines of intermediate frequency close to zero (low-IF)
(c) a processor controlling the set of channels with code generators
(d) a receiving-transmitting device to receive/transmit quadrature signals, the receiving-transmitting device including an RF front-end and antenna; and
(e) an interface connecting the output of the quadrature mixer and receiving-transmitting device to receive/transmit quadrature signals.

In one embodiment, the output of the mixer of the WPRN former transmits a broadcast quadrature signal converted to a radio frequency and/or adds the quadrature signal from the mixer output to a received broadcast signal which was converted by the quadrature signal to zero or near-zero frequency or replace the received and converted to zero or near-zero frequency quadrature signal. In one embodiment, the number of channels in the set of channels is in an integer times greater than the number of weight coefficients in the plurality of weight coefficients, the NCO clock rate is the same integer smaller than the bandwidth of the signal transmitted and/or received by the antenna in the transceiver module.

Figure 1:
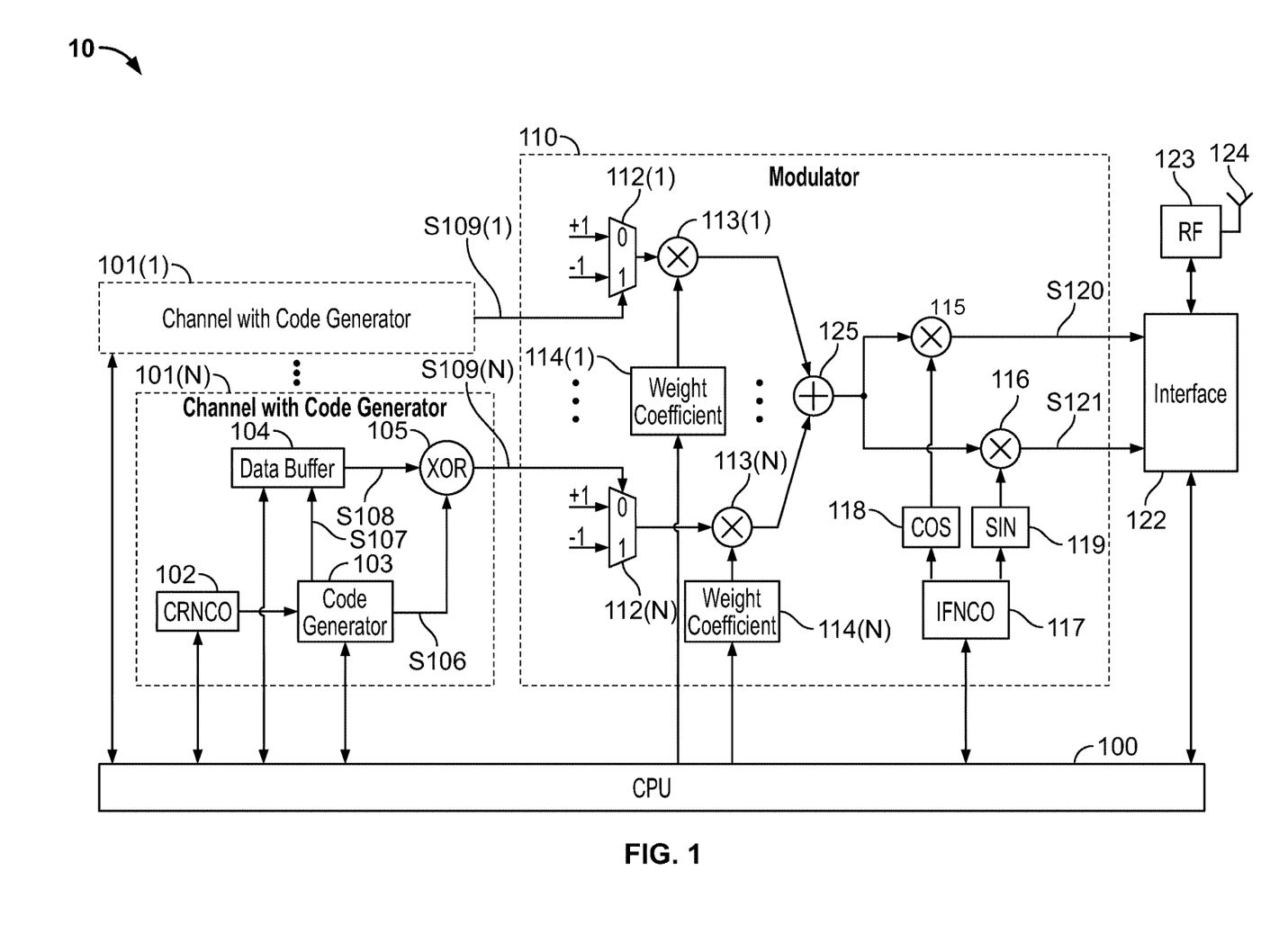
FIG. 1 shows a schematic of a Wideband Pseudo Random Noise ("WPRN") former according to one embodiment.

FIG. 1 shows a schematic of a Wideband Pseudo Random Noise ("WPRN") former 10 according to one embodiment. FIG. 1 shows WPRN former 10 comprising CPU 100, channel with code generator 101(1) . . . 101(N), code rate numerically-controlled oscillator ("CRNCO") 102, code generator 103, data buffer 104, XOR 105, PRN code S106, data synchronization signal S107, data S108, one bit pseudorandom sequence with data S109, modulator 110, weight multiplexer 112(1) . . . 112(N), multiplier unit 113(1) . . . 113(N), 115, 116, weight coefficient 114(1) . . . 114(N), intermediate frequency NCO ("IFNCO") 117, cosine unit 118, sine unit 119, signal with cosine modulation S120, signal with sine modulation S121, interface 122, RF path 123, antenna 124, adder unit 125. In one embodiment, a digital quadrature mixer (i.e., a mixer with a quadrature output) includes unit 115, unit 116, IFNCO 117, cosine unit 118, and sine unit 119.

In one embodiment, before operation, CPU 100 initializes code rate and initial phase of CRNCO 102, code generator 103, data buffer 104, weight coefficient 114(1) . . . 114(N), intermediate frequency of IFNCO 117, and interface 122.

CRNCO 102 generates a strobe at a code rate. The strobe is input to code generator 103. Code generator 103 generates PRN Code S106 which is input to XOR 105. Code generator 103 generates data synchronization signal S107 which is input to data buffer 104. Data buffer 104 outputs signal S108 which is input to XOR 105. Data in signal S108 output from data buffer 104 are modified according to signal S107. If needed, CPU 100 writes new data to data buffer 104. XOR 105 outputs one-bit pseudorandom sequence with data S109.

S109(1) . . . S109(N) are output from channels with code generator 101(1) . . . 101(N) and are input to modulator 110. In modulator 110, signals S109(1) . . . 109(N) are input to the control input of weight multiplexer 112(1) . . . 112(N). If S109 is active, then the value −1 is input to output unit 112, otherwise, the value +1 is input to output unit 112. Output of output unit 112(1) . . . 112(N) is input to multiplier 113(1) . . . 113(N). The output of weight coefficient 114(1) . . . 114(N) is input to multiplier 113(1) . . . 113(N). Output of output unit 112 and output of output unit 114 are multiplied in multiplier 113 and are input to adder 125 where multiplication results 113(1) . . . 113(N) are added. The output of adder 125 is input to multiplier unit 115 and multiplier unit 116.

IFNCO 117 generates an intermediate frequency phase which is input to cosine unit 118 and sine unit 119. The output of cosine unit 118 is input to multiplier unit 115. The output of sine unit 119 is input to multiplier unit 116.

In multiplier unit 115, the output of adder unit 125 is multiplied by the output of cosine unit 118, i.e., the output of adder unit 125 is modulated by the output of cosine unit 118.

In multiplier unit 116, the output of adder unit 125 is multiplied by the output of sine unit 119, i.e., the output of adder unit 125 is modulated by the output of sine unit 119. In one embodiment, multiplier unit 115 and multiplier unit 116 function as a quadrature mixer located in modulator 110. The output of multiplier unit 115 is signal S120. The output of multiplier unit 116 is signal S121. Signal S120 and signal S121 from the output of modulator 110 are input to interface 122. The output of interface 122 is input to RF unit 123 which outputs a signal to antenna 124.

During operation CPU 100 controls code frequency and phase in CRNCO 102, data buffer 104, weight coefficient 114(1) . . . 114(N), and frequency and phase in IFNCO 117. Channels with code generator 101(1) . . . 101(N) generate signals S109(1) . . . S109(N) which are code signal S106 with superimposed data S108, and S109 can be shifted in time (phase) relative to each other.

In modulator 110, signals S109(1) . . . S109(N) are assigned a positive or negative sign and are scaled by weight coefficient 114(1) . . . 114(N) and added and modulated in cosine unit 118 and sine unit 119.

This arrangement makes it possible to generate complicated multi-level composite signals, as well as interpolate and smooth fronts without a classical interpolator with sophisticated control schematics and a great number of multiplying multi-bits data. Both of these functions are implemented using a few NCOs, wherein different code phases and weight coefficients are preset and the results are summed. Since weight coefficients are multiplied by +1 or −1, this multiplication operation can be implemented by compact multipliers taking smaller space than that of multi-bit multipliers.

A signal at the output of adder unit 125 can be brought to intermediate frequency by multiplying by sine and cosine. In one embodiment, this operation is needed for most solved tasks.

Depending on the problem being solved, different embodiments of interface 122 can be used in the apparatus. Such embodiments can be modified by reconfiguring of the interface, so that the same apparatus can be used for different applications. FIGS. 2A, 2B, 2C, and 2D show different embodiments of interface 122.

Figure 2A:
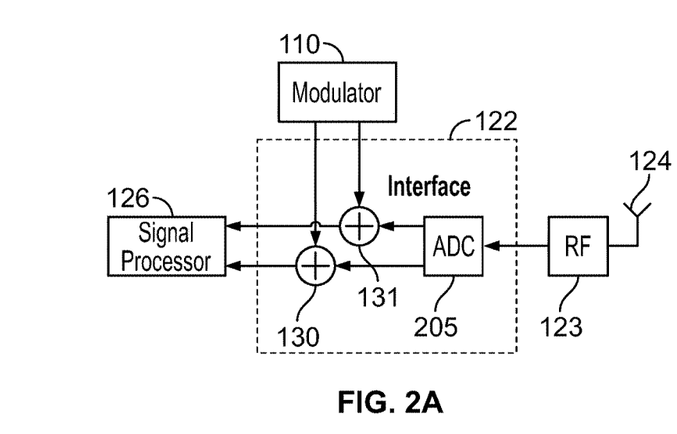
FIG. 2A shows details of one embodiment of the interface shown in FIG. 1 for local positioning to subtract a third party's interference signal from a received signal.

FIG. 2A shows interface 122 comprising: analog to digital convertor ("ADC") 205 and adder unit 130 and adder unit 131. From RF front-end 123 a signal is fed to ADC 205 and digitized, then the digitized quadrature signal is input to adder unit 130 and adder unit 131 where it is added to the signal of multiplier unit (also referred to as quadrature mixer) 115 and multiplier unit (also referred to as quadrature mixer) 116. The output of adder unit 130 and adder unit 131 is input to signal processor 126 for further processing. This interface implementation can be used for local positioning to subtract a third party's interference signal from the received signal.

Figure 2B:
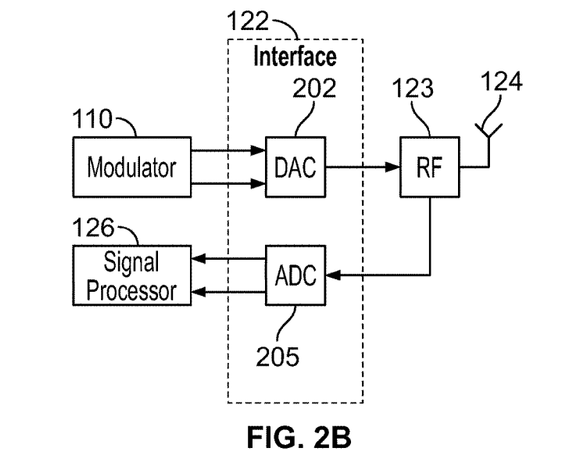
FIG. 2B shows details of one embodiment of the interface shown in FIG. 1 for Global Navigation Satellite System ("GNSS") receiver calibration.

FIG. 2B shows interface 122, which includes: digital to analog convertor ("DAC") 202 and ADC 205. The output of quadrature mixer 115 and quadrature mixer 116 is input to DAC 202, and then is converted to the intermediated radio frequency in the transmitting portion of RF front-end 123. It is then moved to zero or near-zero frequency in the receiving portion of RF 123, with either the signal is added to the received broadcasting radio signal from antenna 124 or replacing the received broadcasting signal from antenna 124. Such an implementation can be applied for GNSS receiver calibration. In some embodiments, the RF front-end is calibrated before the GNSS receiver starts to search and track satellite signals. In such embodiments, during a calibration phase the signal from the antenna is replaced by the generated signal by means of an RF-switch. After the calibration phase the RF-switch is reconfigured to provide a path for satellite signals from the antenna. In other embodiments, the RF front-end is calibrated simultaneously with satellite signal reception. In this embodiment the generated signal with relatively weak power is added to the signal from antenna. A combiner, differential operational amplifier or other RF components can be used for summing the signals.

In some embodiments the signal output by the transmitting portion of RF front-end 123 is a calibrating signal. The calibrating signal, in some embodiments, resembles GNSS navigation signals. In some embodiments, the calibrating signal is a particular signal with characteristics that do not resemble characteristics of GNSS navigation signals. In some embodiments, characteristics of the particular signal are periodically modified during calibration process.

Figure 2C:
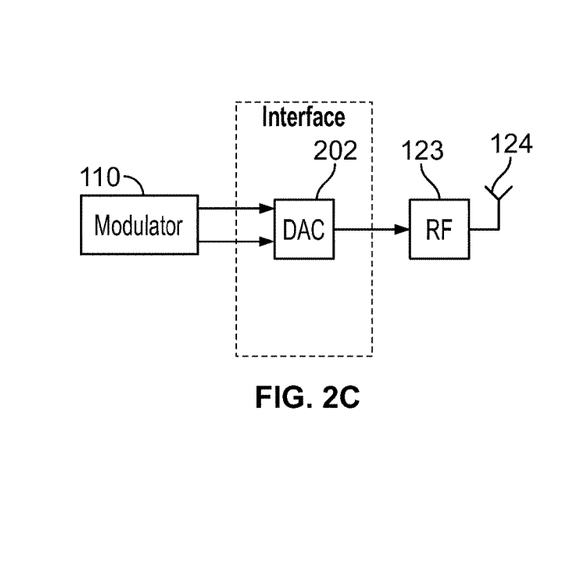
FIG. 2C shows details of one embodiment of the interface shown in FIG. 1 for local positioning in transmitters.

FIG. 2C shows interface 122 including DAC 202. The output signal of quadrature mixer 115 and quadrature mixer116 passes through DAC 202, then is converted to the intermediate radio frequency in the transmitting portion of RF 123. Such an implementation can be used for local positioning in transmitters. In some embodiments, code phase and/or carrier phase of the generated signal are adjusted according to corresponding code and/or carrier phase of a master transmitter or according to a GNSS reference signal. In other embodiments, the parameters are adjusted according to a reference signal being locally connected to the transmitter.

Figure 2D:
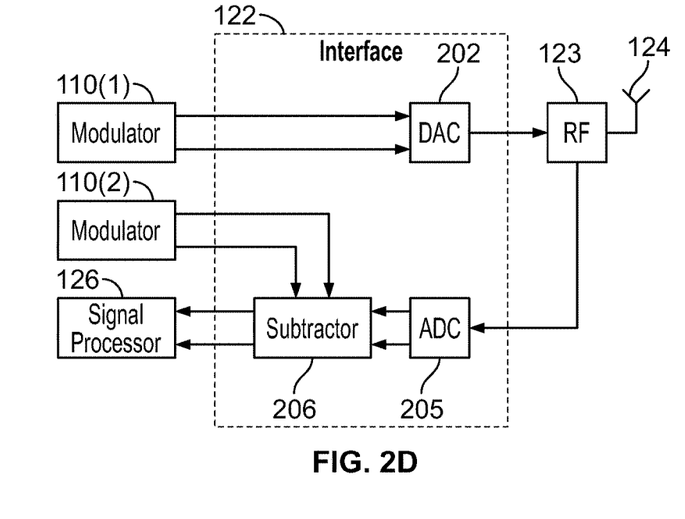
FIG. 2D shows details of one embodiment of the interface shown in FIG. 1 that allows transmitting a signal to an antenna and subtracting a near-end echo of a transmitter from the signal received from this antenna or another antenna in mm-range radars.

FIG. 2D shows interface 122 comprising subtractor 206, DAC 202 and ADC 205. The output signal from modulator 110(1) passes through DAC 202, then is converted to the intermediate frequency in the transmitting portion of RF 123. Another operation mode is also possible. In this other operation mode, when a broadcasting signal is input to the receiving portion of RF 123 where it is converted to zero or near-zero frequency, the signal is then digitized and, in subtractor 206, it is added to or subtracted from the signal from modulator 110(2). This implementation allows transmitting the signal to an antenna and subtracting the near-end echo of the implementation's own transmitter from the signal received from this or another antenna in millimeter-range radars.

Figure 3:
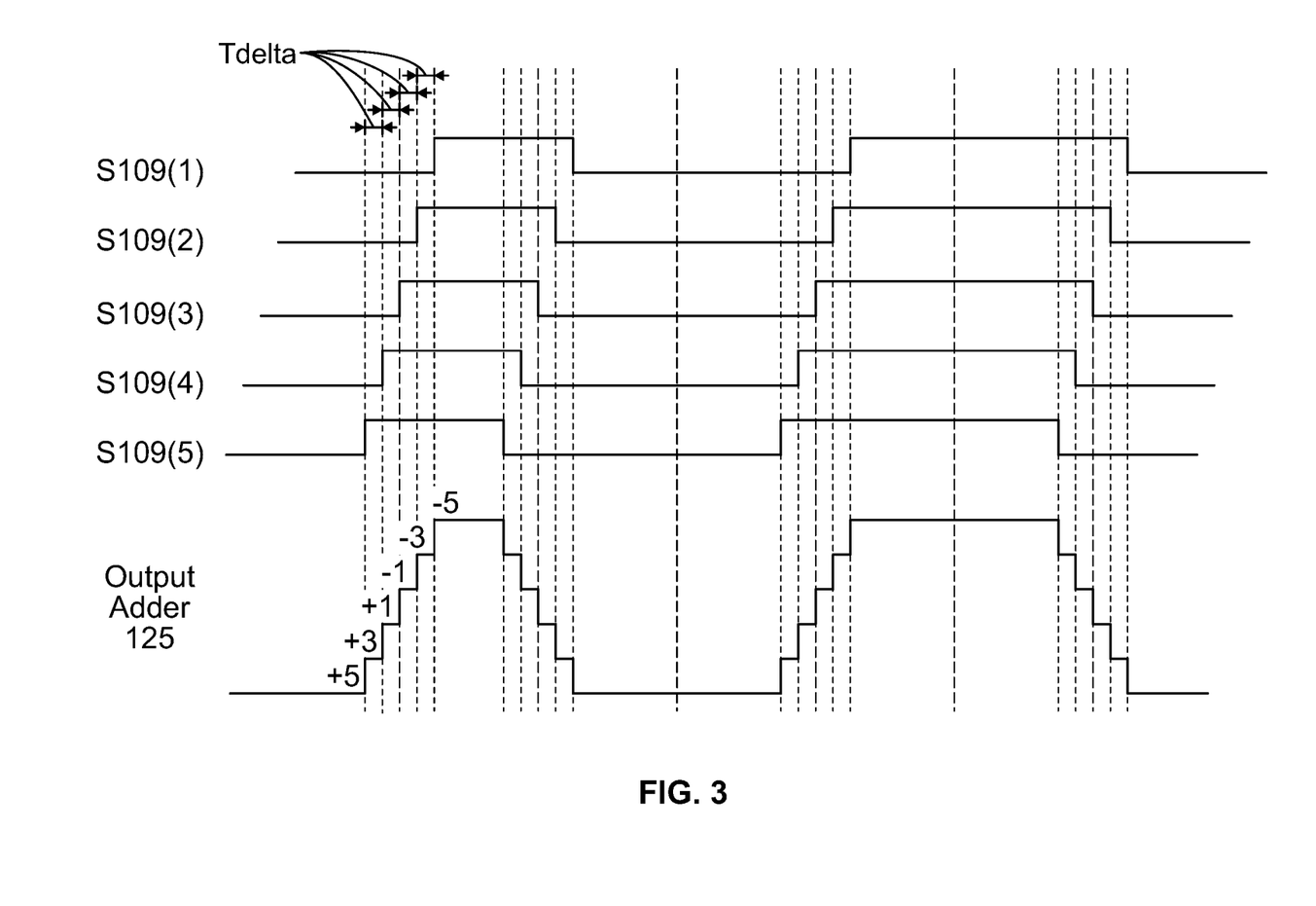
FIG. 3 shows a particular case of use of a channel with code generator according to one embodiment.

FIG. 3 shows a particular case in which the channel with code generator 101(1), 101(2), 101(3), 101(4), and 101(5) generates signals S109(1), S109(2), S109(3), S109(4), and S109(5). At the same time, PRN codes S106 (shown in FIG. 1) are phase shifted relative to each other by Tdelta. Tdelta are used when specifying the phase offset of the code frequency in CRNCO 102 during initialization. Weight coefficients 114(1), 114(2), 114(3), 114(4), and 114(5) are set equal to a value of +1, weight coefficient (6) . . . weight coefficient (N) equal to the value of 0. At the output of adder 125, a multi-level PRN Code with tilted edges is generated.

Figure 4:
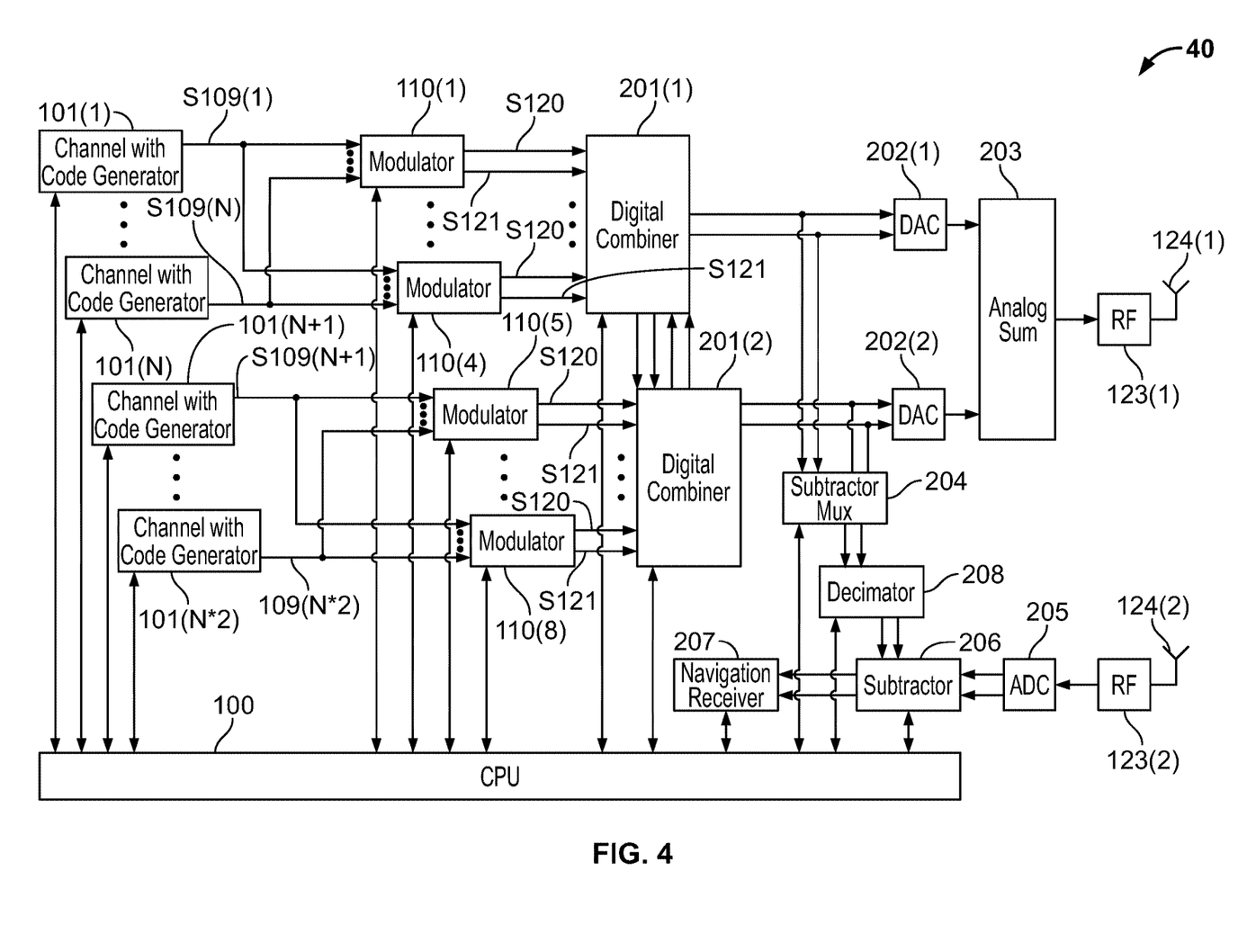
FIG. 4 shows a WPRN former including additional components according to an embodiment.

FIG. 4 shows an embodiment of a WPRN former that includes additional components. In one embodiment, WPRN former 40 can be implemented with two antennas (transmitting 124(1), receiving 124(2)) or with single receiving-transmitting antenna 124 (not shown).

The following components are added to the embodiment shown in FIG. 1 to assemble a more complex embodiment of WPRN former 40 as shown in FIG. 4: digital combiner 201(1) . . . 201(2), DAC 202(1) . . . 202(2), analog sum unit 203, subtractor mux 204, ADC 205, subtractor unit 206, navigation receiver 207, and decimator 208.

In the complex embodiment shown in FIG. 4, the number of the following units increases: Modulator 110(1) . . . 110(8), RF- path 123(1) . . . 123(2), antenna 124(1) . . . 124(2), channels with code generator 101(1) . . . **101(N*2)**.

WPRN former 40 operates at synchronous clock speeds CLKsend and CLKch. In one embodiment, CLKsend and CLKch can have the same rate. CLKch can be also, for example, twice (or 2^M times) as slow as CLKsend.

The following components of WPRN former 40 operate at CLKsend clock speed: channel code generator 101(1) . . . **101(N*2), Modulator 110(1) . . . 110(8), digital combiner 201(1) . . . 201(2), DAC 202(1) . . . 202(2), subtractor mux 204, and a portion of decimator 208. The following components of WPRN former 40 operate at CLKch clock speed: a portion of decimator 208, subtractor 206, navigation receiver 207, and ADC 205**.

Before operation, CPU 100 adjusts: channel code generator 101(1) . . . **101(N*2), modulator 110(1) . . . 110(8), digital combiner 201(1) . . . 201(2), subtractor mux 204, decimator 208, subtractor 206, navigation receiver 207**, and ratio of clocks CLKsend and CLKch.

Channel with code generator 101 generates signal S109. From the output of channel with code generator 101(1) . . . 101(N) signals S109(1) . . . S109(N) are input to modulator 110(1) . . . 110(4) where they are scaled and down converted to the intermediate frequency. Signals S120 and S121 from the output of Modulator 110(1) . . . 110(4) are input to digital combiner 201(1) with further conversion. From the output of Digital combiner 201(1) they are fed to the input of DAC 202(1) and Subtractor mux 204.

Returning to FIG. 1, in various embodiments, interface 122 comprises:

(1) a quadrature DAC 202(1) and quadrature DAC 202(2), DAC 202(2) is subject to clocking with a half-period delay relative to DAC 202(1);

(2) a splitter circuit with two quadrature inputs and two quadrature outputs, converting the quadrature outputs of the mixers of modulators 110(1) . . . 110(8), the quadrature outputs of which are connected to inputs of DAC202(1) and DAC202(2);

(3) an analog component wise addition module for two quadrature signals to obtain one quadrature signal, the splitter generating quadrature outputs of mixers such that after addition in the analog component wise addition module there is a signal shaped as a DAC double clock rate signal (signal with double clock rate of DAC), in this signal, even samples are output signals of the mixer of one modulator, odd samples are the mixer's output signals of the other modulator, the output of said analog component wise addition module is connected with RF front-end, and the output of RF front-end is connected with the transmitting antenna. The apparatus is part of a local positioning transmitter of signals. In one embodiment, the splitter is part of digital combiner 201.

Returning to FIG. 4, signal S109(N+1) . . . S**109(N*2) from the output of channels with code generator 101(N+1) . . . 101(N*2) are input to modulator 110(5) . . . 110(8) where they are modulated. From the output of modulator 110(5) . . . 110(8), signals S120 and S121 are input to digital combiner 201(2) and are converted there. From the output of digital combiner 201(2) the signals are input to DAC 202(2) and subtractor mux 204**.

Signals from the output of DAC 202(1) . . . DAC(2) are added in analog Sum 203 and further are input to RF-path 123(1). Operation amplifier can serve as analog sum 203. After passing through RF-path 123(1), the signal is transmitted to antenna 124(1).

The output of subtractor mux 204 is input to decimator 208. In decimator 208, the signal is decimated according to the preset ratio of clock speeds CLKsend and CLKch. The output signal from decimator 208 is input to subtractor 206.

The signal from antenna 124(2) is input to RF-path 123(2). Once RF-path 123(2) is passed, the signal is input to ADC 205. The digitized signal from the output of ADC 205 is input to subtractor 206.

In subtractor 206, if needed (e.g., it is assigned by CPU 100), a signal from the output of decimator 208 is subtracted from the sampled signal from the output of ADC 205, and it is input to navigation receiver 207. In navigation receiver 207, the signal is processed.

In one embodiment, in operation, CPU 100 controls: channels with code generator 101(1) . . . **101(N*2), modulator 110(1) . . . 110(8), digital combiner 201(1) . . . 201(2), subtractor mux 204, decimator 208, subtractor 206, and navigation receiver 207**.

Figure 5:
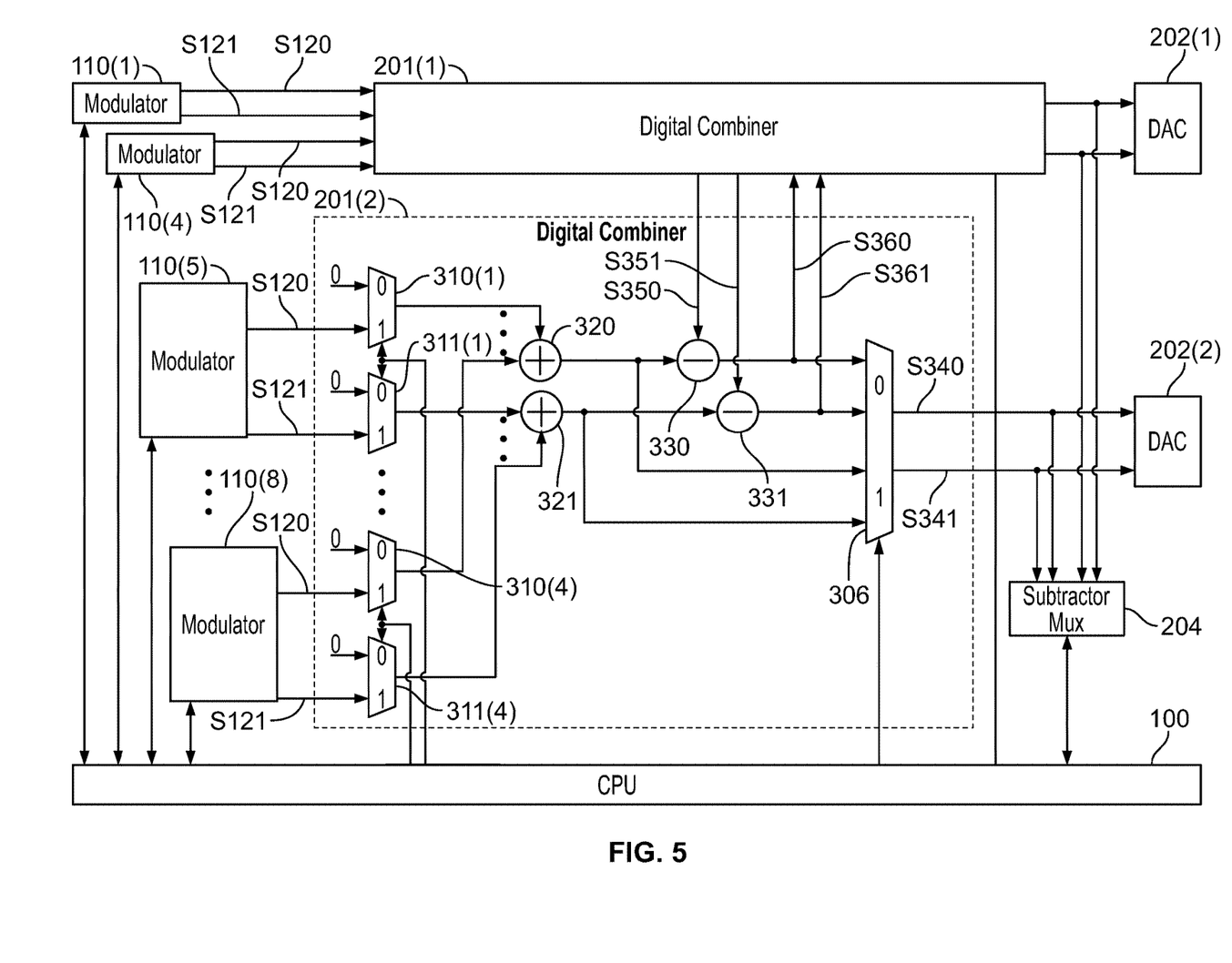
FIG. 5 shows a block diagram of an embodiment including a digital combiner.

FIG. 5 shows a block diagram of an embodiment including a digital combiner circuit. In one embodiment, the digital combiner comprises: Multiplexer 310(1 . . . 4), 311(1 . . . 4), 306, adder 320, 321, subtraction unit 330, 331 in digital combiner 201, splitter signal S350, S351, S360, S361, and DAC input signal S340, S341.

In one embodiment, CPU 100 initiates and controls: modulator 110(1) . . . 110(8) and subtractor mux 204. Before operation, CPU 100 adjusts multiplexer 310(1) . . . (310(4), multiplexer 311(1) . . . 311(4), and multiplexer 306. Digital combiner 201(1) and digital combiner 201(2) are paired.

Signals S120 and S121 from the output of Modulator 110(1) . . . 101(4) are input to digital combiner 201(1). Signals S120 and S121 from the output of Modulator 110(5) . . . 110(8) are input to digital combiner 201(2).

Signal S120 is input to multiplexer 310(1) . . . 310(4). If the signal at the control input of multiplexer 310(1) . . . 310(4) is active, then at the output there is signal S120, otherwise, at the output is value 0. The output signals of multiplexer 310(1) . . . 310(4) are input to adder unit 320, and are added. The output signal of adder unit 320 is input to subtraction unit 330 and multiplexer 306.

Signal S121 is input to multiplexer 311(1) . . . 311(4). If the signal at the control input of multiplexer 311(1) . . . 311(4) is active, then at the output there is signal S121, otherwise, at the output is value 0. The output signals of multiplexer 311(1) . . . 311(4) are input to adder unit 321, and are added. The output signal of adder unit 321 is input to subtraction unit 331 and multiplexer 306.

Signal S350 is signal S360 from the paired digital combiner 201. Signal S350 is input to subtraction unit 330 and adder unit 320. In subtraction unit 330, signal S350 is subtracted from the output signal of adder unit 320. Output signal of subtraction unit 330 is signal S360. S360 is fed to the input of multiplexer 306 and to the paired digital combiner 201. In some embodiments, the digital combiner 201(1) has a delay of signal S360.

Signal S351 is signal S361 from the paired digital combiner 201. Signal S351 is input to subtraction unit 331 and adder unit 321. In subtraction unit 331, signal S351 is subtracted from the output signal of adder unit 321. Output signal of subtraction unit 331 is signal S361. Signal S361 is input to multiplexer 306 and to the paired digital combiner 201. In some embodiments, the digital combiner 201(1) has a delay of signal S361.

If the signal at the control input of multiplexer 306 is inactive, then signal S360 is fed to the output, and signal S340 becomes equal to S360.

If the signal at the control input of multiplexer 306 is inactive, then signal S361 is fed to the output, and signal S341 becomes equal to S361.

If the signal at the control input of multiplexer 306 is active, then the output signal of unit 320 is fed to the output, and signal S340 becomes equal to the output signal of unit 320.

If the signal at the control input of multiplexer 306 is active, then the output signal of adder unit 321 is fed to the output, and signal S341 takes the value of the output signal of adder unit 321.

Signals S340 and S341 from the output of digital combiner 201(2) are input to DAC 202(2) and subtractor mux 204.

From the output of modulator 110(1) . . . 110(4), signals S120 and S121 are input to digital combiner 201(1). Digital combiner 201(1) operates in a similar mode to digital combiner 201(2). From the output of digital combiner 201(1) signals S340 and S341 are input to DAC 202(1) and subtractor mux 204.

Figure 6:
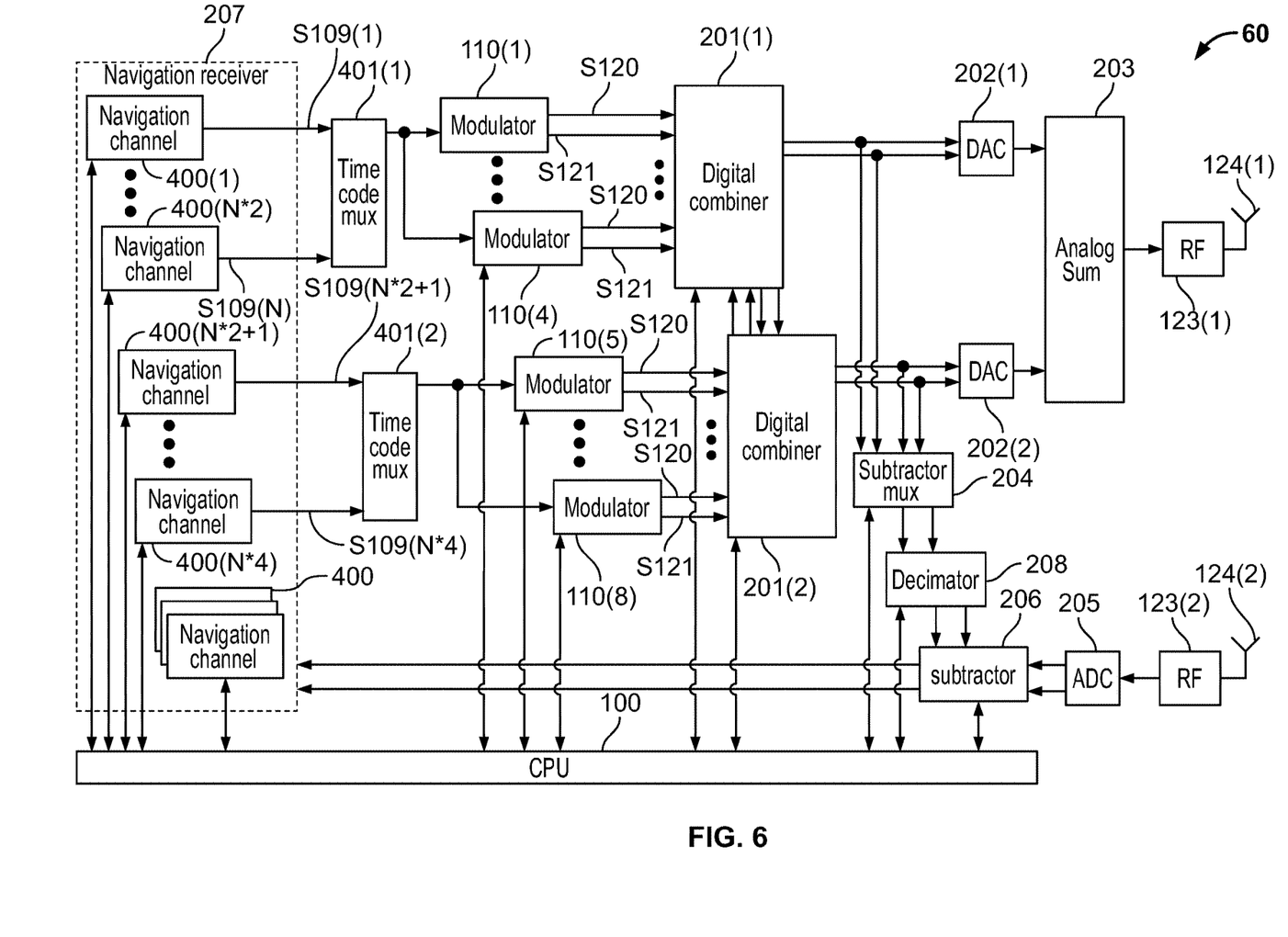
FIG. 6 shows a schematic of a WPRN former for use with a navigation receiver.

FIG. 6 shows one embodiment using a complex embodiment of WPRN former 60 with a navigation receiver. In this embodiment, instead of channel with code generator 101 there is navigation channels 400. This embodiment also includes time code mux 401(1) . . . 401(2). Also, in this embodiment clock CLKch is twice as slow as CLKsend.

In this embodiment, navigation channel 400(1) . . . 400(N*4) are used to generate signals S109, the rest of navigation channels 400 (with numbers greater than N*4 to N*4+K. Where K is the limit amount of navigation signals which need to be received, it is a sufficient number of channels to receive needed signals) process the signal arriving from subtractor 206. Time code mux 401(1) . . . 401(2) operates at clock speed CLKsend.

In one embodiment, before operation, CPU 100 adjusts navigation channel 400(1) . . . 400(N*4), modulator 110(1) . . . 110(8), digital combiner 201(1) . . . 201(2), subtractor mux 204, decimator 208, subtractor 206, navigation receiver 207 (for channel numbers are greater than N*4 to N*4+K), and the ratio of clock speeds for CLKsend and CLKch.

In this embodiment, navigation Channel 400(1) . . . 400(N*4) generates signal S109(1) . . . S109(N*4). Signals S109(1) . . . S109(N*2) from outputs of navigation channels 400(1) . . . 400(N*2) are input to time code mux 401(1) where signal S109 is selected in time. The output of time code mux 401(1) is input to modulator 110(1) . . . 110(4) where it is scaled and down converted to the intermediate frequency. From the output of Modulator 110(1) . . . 110(4), signals S120 and S121 are input to Digital combiner 201(1) for further conversion. From the output of digital combiner 201(1) they are input to DAC 202(1) and subtractor mux 204.

Signals S109(N*2+1) . . . S109(N*4) from the outputs of navigation Channels 400(N*2+1) . . . 400(N*4) are input to Time code mux 401(2), in this unit signal S109 is selected in time. The output of time code mux 401(2) is input to modulator 110(5) . . . 110(8) where it is scaled and down converted to the intermediate frequency. From the output of modulator 110(5) . . . 110(8) signals S120 and S121 are input to Digital combiner 201(2) for further conversion. From the output of digital combiner 201(2) they are input to DAC 202(2) and subtractor mux 204.

DAC 202(2) operates at a clock with a half-period delay relative to the clock of DAC 202(1).

Signals output from DAC 202(1) . . . DAC(2) are added in analog sum 203, and the obtained signal is close in value to a signal with double the clock rate of DAC is fed to the RF-path 123(1). In one embodiment, operation amplifier can serve as analog sum 203. RF 123(1) path outputs the signals that are then input to antenna 124(1).

Signals from a selected digital combiner 201(1) . . . 201(2) pass through subtractor mux 204. The output signal of subtractor mux 204 is input to decimator 208. In decimator 208, the signal is decimated according to the preset clock ratio of CLKsend and CLKch. The output signal of decimator 208 is input to Subtractor 206.

Antenna signal 124(2) is input to RF-path 123(2). After RF-path 123(2) the signal is input to ADC 205. Then, the sampled(digitized) signal from the output of ADC 205 is input to subtractor 206. In subtractor 206, if CPU 100 assigns it, the output signal of decimator 208 is subtracted from the sampled signal from the output of ADC 205, and it is fed to the input of navigation receiver 207 wherein it is processed.

In one embodiment, during operation, CPU 100 controls navigation channel 400(1) . . . 400(N*4), modulator 110(1) . . . 110(8), digital combiner 201(1) . . . 201(2), subtractor mux 204, decimator 208, subtractor 206, and navigation receiver 207(the number of Channel 400 is greater than N*4 to N*4+K).

Figure 7:
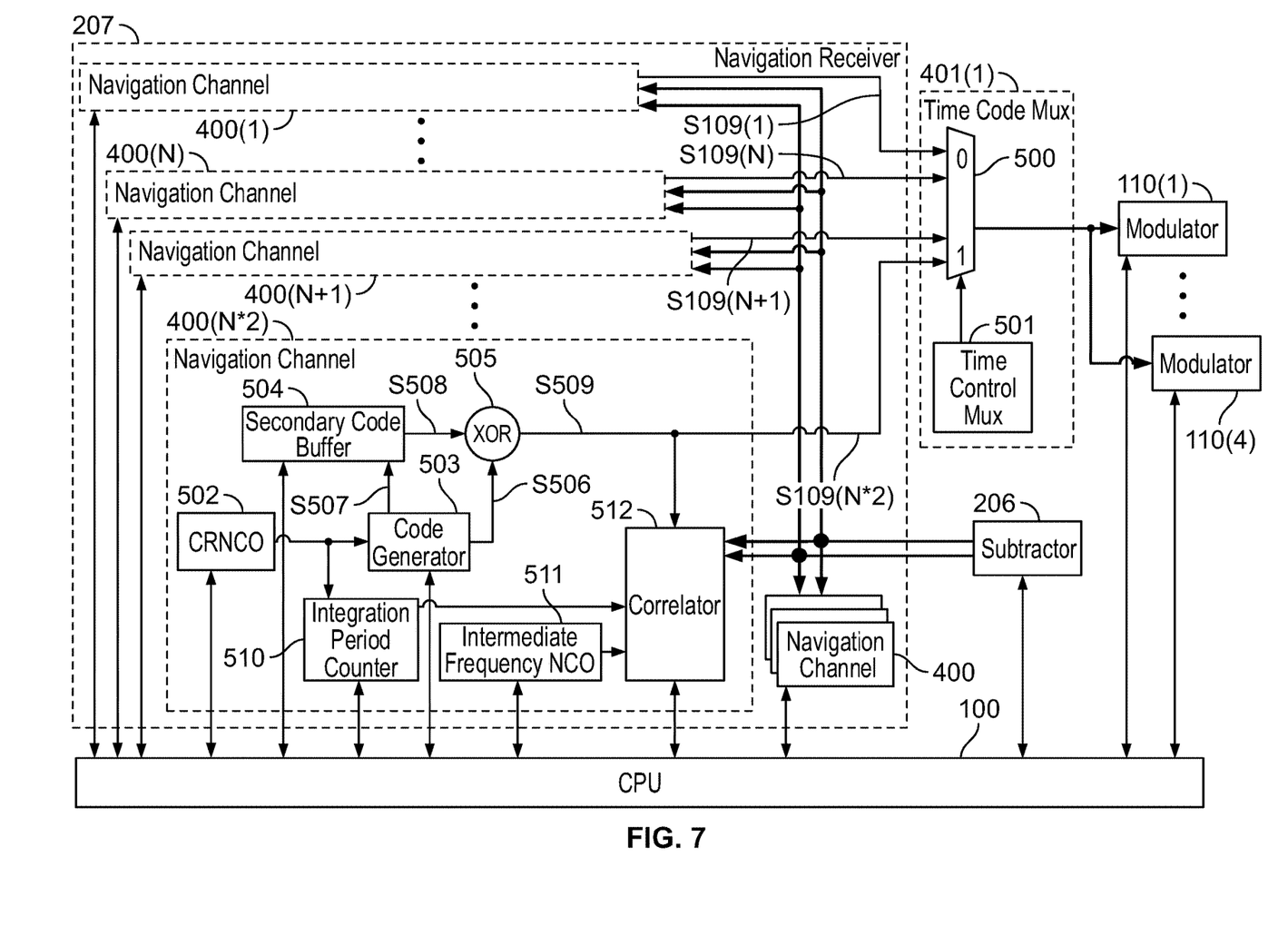
FIG. 7 show a schematic of a time code mux and navigation channels according to an embodiment.

FIG. 7 shows a schematic of time code mux and navigation channels according to an embodiment. In this embodiment, navigation channel 400 is used instead of channel with code generator 101. Clock CLKch is twice as slow as CLKsend. This embodiment comprises multiplexer 500, time control mux 501, CRNCO 502, code generator 503, secondary code buffer 504, XOR 505, PRN code signal S506, data synchronization signal S507, secondary code signal S508, one bit pseudorandom sequence with data S509, integration period counter 510, navigation channel intermediate frequency NCO 511, and correlator 512. Secondary code buffer 504 is used to generate secondary code signal S508 via which data is transferred. In one embodiment, secondary code buffer 504 is used as data buffer 104.

In one embodiment, CPU 100 initiates and controls modulator 110(1) . . . 100(4) and subtractor 206. Before operation, CPU 100 initializes the following units in navigation channel 400(1) . . . 400(N*2): code frequency and initial phase in CRNCO 502, code generator 503, and secondary code buffer 504. In one embodiment, the following units are not used in navigation channel 400(1) . . . 400(N*4) during operation: integration period counter 510, navigation channel intermediate frequency NCO 511, and correlator 512. In one embodiment, before operation, CPU 100 initializes navigation channel (greater than N*4 to N*4+K) and, in operation, CPU 100 controls navigation channels 400.

CRNCO 502 generates code frequency which is input to code generator 503. Code generator 503 forms PRN Code S506, which is input to XOR 505. Code generator 503 generates data synchronization signal S507, which is then input to secondary code buffer 504. Secondary code signal S508 is output from secondary code buffer 504 and is input to XOR 505. Secondary code signal S508 at the output of secondary code buffer 504 is modified according to signal S507. CPU 100 may additionally write new data to secondary code buffer 504. One bit pseudorandom sequence with data S509 is output from XOR 505.

In one embodiment, signal S509 is the same as signal S109. Signals S109 from Navigation Channels 400(1 . . . N*4) are fed to Time code mux 401(1) and at the input of multiplexer 500. Signal S109 (S509) is generated at clock CLKch. Time code mux 401(1) operates at CLKsend which is twice as much as CLKch. Time control mux 501 generates at its output a meandering signal which is changed each clock pulse of clock CLKsend. The output signal of time control mux 501 is input to control input of multiplexer 500. If the state at the control input of multiplexer 500 is inactive, then signals S109(1) . . . S109(N) are output, otherwise, signals S109(N+1) . . . S109(N*2) are output. A signal from the output of unit 401(1) is input to modulator 110(1) . . . 110(4). Navigation Channels 400(greater than N*4 to N*4+K) process signals from the output of subtractor 206.

In one embodiment, a method for forming pseudo-random wideband signals comprises the steps of controlling a frequency and a phase of a plurality of NCOs each associated with a respective one of a set of channels, generating, by one of the plurality of NCOs, a strobe that is output to a PRN code generator, forming, by the PRN code generator, a new sequence element of +1 or −1 in response to the strobe, multiplying, by one of a plurality of multipliers, one of a plurality of weight coefficients by an output of the PRN code generator, outputting, from an adder, a sum of the plurality of multiplier's output signals. multiplying, by a mixer with a quadrature output signal, the adder's output by sine and cosine of a low intermediate frequency, receiving quadrature signals by a transceiver module, and transmitting quadrature signals by the transceiver module, wherein the transceiver module transmits the quadrature signal output from the mixer converted to a radio frequency, and adds the quadrature signal to a quadrature signal received from the antenna and converted to a zero or a near-zero frequency, or replaces the quadrature signal received from the antenna and converted to the zero or the near-zero frequency signal. In one embodiment of the method, the steps of the method mitigate an unwanted signal from one of the transceiver module or a transmitter located within transmission distance of the transceiver module, the unwanted signal being received along with a navigation signal from the antenna. In one embodiment of the method, the steps of the method form a combined signal that comprises a signal received from the antenna and a locally generated signal, the combined signal processed by a GNSS receiver to obtain a position of the GNSS receiver, the combined signal processed as a calibrating signal to calibrate the receiver RF front-end simultaneously with satellite signal reception.

The foregoing Detailed Description is to be understood as is in every respect illustrative and exemplary, but not restrictive, and the scope of the inventive concept disclosed herein is not to be determined from the Detailed Description, but rather from the claims as interpreted according to the full breadth permitted by the patent laws. It is to be understood that the embodiments shown and described herein are only illustrative of the principles of the inventive concept and that various modifications may be implemented by those skilled in the art without departing from the scope and spirit of the inventive concept. Those skilled in the art could implement various other feature combinations without departing from the scope and spirit of the inventive concept.

The invention claimed is:

1. An apparatus for forming pseudo-random wideband signals comprising:
    (a) a set of channels each comprising a numerically controlled oscillator (NCO) having a controlled frequency and phase and a PRN code generator, the NCO configured to generate a strobe that is output to the PRN code generator, and the PRN code generator configured to form a new sequence element of +1 or −1 in response to the strobe;
    (b) a first modulator comprising:
        (1) a plurality of weight coefficients;
        (2) a plurality of multipliers each configured to multiply one of the plurality of weight coefficients by the output of the PRN code generator;
        (3) an adder configured to output a sum of the plurality of multipliers output signals; and
        (4) a mixer with a quadrature output signal configured to multiply the adder's output by sine and cosine of a low intermediate frequency (low-IF);
    (c) a processor configured to control the set of channels;
    (d) a transceiver module configured to receive and/or transmit quadrature signals, the transceiver comprising an RF front-end and an antenna; and
    (e) an interface configured to connect an output of the mixer and the transceiver module,
    wherein the transceiver module is configured to transmit the quadrature signal output from the mixer converted to a radio frequency, or to add the quadrature signal to a quadrature signal received from the antenna and converted to a zero or a near-zero frequency, or replace the quadrature signal received from the antenna and converted to the zero or the near-zero frequency signal.

2. The apparatus of claim 1, wherein the interface comprises a quadrature DAC, the input of the quadrature DAC is connected to the output of the mixer, and the output of the quadrature DAC is connected to the RF front-end.

3. The apparatus of claim 1, wherein the interface comprises a quadrature ADC, the input of quadrature ADC is connected to the RF front-end, and the output of the quadrature ADC is added to the output of the quadrature mixer.

4. The apparatus of claim 1, the interface further comprising: a quadrature ADC and quadrature DAC, the input of the quadrature ADC and the output of the quadrature DAC are connected to the RF front-end, the signal from the output of the quadrature DAC is converted to an intermediate frequency or a radio frequency in a transmitting portion of the RF front-end, and then is converted back to a zero or a near-zero frequency in a receiving portion of the RF front-end, the signal is added at a radio frequency to a signal received from an antenna broadcasting radio or replacing the signal received from antenna broadcasting radio.

5. The apparatus of claim 2, wherein the output of the RF front-end is sent to the antenna, the apparatus is part of a transmitter of local positioning signals.

6. The apparatus of claim 3, wherein the input of the RF front-end is connected to the antenna, the apparatus is part of a receiver of local positioning signals.

7. The apparatus of claim 4 wherein the input of a receiving portion of the RF front-end is connected to the antenna, the apparatus is part of a GNSS receiver.

8. The apparatus of claim 1, further comprising a second modulator similar to the first modulator.

9. The apparatus of claim 8, the interface further comprising a quadrature ADC and a quadrature DAC, the mixer's output of one of the modulators is subtracted from the output ADC signal, the mixer's output of another of the modulators is connected to a transmitting part portion of the RF front-end across the quadrature DAC, the output of the transmitting portion of the RF front-end is connected to a receiving-transmitting antenna, the receiving-transmitting antenna is also connected to the receiving portion of the RF front-end, the output of the receiving portion of the RF front-end is connected to the quadrature ADC, and the apparatus is part of a radar.

10. The apparatus of claim 1 wherein the number of channels in the set of channels is in an integer times greater than the number of weight coefficients in the plurality of weight coefficients, the NCO clock rate is the same integer smaller than the bandwidth of the signal transmitted and/or received by the antenna in the transceiver module.

11. The apparatus of claim 8, the interface further comprising:
(1) a first DAC and a second DAC, the second DAC configured to operate at a clock speed with a half-period delay relative to the first DAC;
(2) a splitter with two quadrature inputs and two quadrature outputs configured to convert mixer quadrature outputs of the first modulator and the second modulator, the quadrature outputs of the splitter are connected to the inputs of the first DAC and the second DAC; and
(3) a module of analog addition of two quadrature signals from the two DAC to obtain a single quadrature signal, wherein the splitter converting the quadrature outputs of the mixers such that after addition of the outputs of the mixers a signal shaped as a signal with double DAC clock rate is generated and, in this signal, the even samples are samples from the mixer outputs of one modulator, and the odd samples are the mixer outputs of another modulator, the output of the analog addition module is connected to the RF front-end, the output of the RF front-end is connected to a transmitting antenna, and the entire device is part of a transmitter of local positioning signals.

12. The apparatus of claim 11, wherein the analog addition module in the interface is implemented using a differential operational amplifier.

13. The apparatus of claim 11, wherein the analog addition module in the interface is implemented using a combiner.

14. The apparatus of claim 1, further comprising modulators similar to the first modulator, the mixer outputs of the modulators input to a quadrature adder, and the output of the quadrature adder input to the interface.

15. The apparatus of claim 1, wherein a navigational channel can be used as one of the set of channels.

16. A method for forming pseudo-random wideband signals, the method comprising:
controlling a frequency and a phase of a plurality of NCOs each associated with a respective one of a set of channels;
generating, by one of the plurality of NCOs, a strobe that is output to a PRN code generator;
forming, by the PRN code generator, a new sequence element of +1 or −1 in response to the strobe;
multiplying, by one of a plurality of multipliers, one of a plurality of weight coefficients by an output of the PRN code generator;
outputting, from an adder, a sum of the plurality of multiplier's output signals;
multiplying, by a mixer with a quadrature output signal, the adder's output by sine and cosine of a low intermediate frequency;
receiving quadrature signals by a transceiver module; and
transmitting quadrature signals by the transceiver module,
wherein the transceiver module transmits the quadrature signal output from the mixer converted to a radio frequency, and adds the quadrature signal to a quadrature signal received from an antenna and converted to a zero or a near-zero frequency, or replaces the quadrature signal received from the antenna and converted to the zero or the near-zero frequency signal.

17. The method of claim 16, wherein the steps of the method mitigate an unwanted signal from one of the transceiver module or a transmitter located within transmission distance of the transceiver module, the unwanted signal being received along with a navigation signal from the antenna.

18. The method of claim 16, wherein the steps of the method form a combined signal that comprises a signal received from the antenna and a locally generated signal, the combined signal processed by a GNSS receiver to obtain a position of the GNSS receiver, the combined signal processed as a calibrating signal to calibrate the receiver RF front-end simultaneously with satellite signal reception.

* * * * *